(12) United States Patent
Noda et al.

(10) Patent No.: US 9,793,200 B2
(45) Date of Patent: Oct. 17, 2017

(54) PRINTED WIRING BOARD

(71) Applicant: IBIDEN CO., LTD., Ogaki-shi (JP)

(72) Inventors: Kota Noda, Ogaki (JP); Takeshi Furusawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 197 days.

(21) Appl. No.: 14/741,122

(22) Filed: Jun. 16, 2015

(65) Prior Publication Data

US 2015/0366062 A1  Dec. 17, 2015

(30) Foreign Application Priority Data

Jun. 17, 2014  (JP) ................. 2014-124045

(51) Int. Cl.
*H05K 1/11* (2006.01)
*H05K 1/14* (2006.01)
(Continued)

(52) U.S. Cl.
CPC .. *H01L 23/49822* (2013.01); *H01L 23/49827* (2013.01); *H01L 23/49833* (2013.01); *H01L 25/105* (2013.01); *H05K 3/4697* (2013.01); *H01L 23/49811* (2013.01); *H01L 23/49838* (2013.01); *H01L 24/13* (2013.01); *H01L 24/16* (2013.01); *H01L 2224/131* (2013.01); *H01L 2224/16227* (2013.01); *H01L 2224/16237* (2013.01); *H01L 2224/81192* (2013.01); *H01L 2224/81395* (2013.01); *H01L 2224/81411* (2013.01); *H01L 2224/81444* (2013.01); *H01L 2224/81447* (2013.01);
(Continued)

(58) Field of Classification Search
CPC ............... H05K 1/14; H05K 1/111; H05K 1/141–1/144; H05K 1/162; H01L 29/49822
USPC ................. 361/792–795, 760–764, 803; 174/250–268
See application file for complete search history.

(56) References Cited

U.S. PATENT DOCUMENTS 8,183,465 B2 * 5/2012 Suzuki ............... H01L 21/4857
174/250
8,890,002 B2 * 11/2014 Arai .................. H01L 23/49827
174/265

(Continued)

FOREIGN PATENT DOCUMENTS

JP  2007-123524  5/2007

OTHER PUBLICATIONS

U.S. Appl. No. 14/741,011, filed Jun. 16, 2015, Noda, et al.

*Primary Examiner* — Tuan T Dinh
(74) *Attorney, Agent, or Firm* — Oblon, McClelland, Maier & Neustadt, L.L.P.

(57) ABSTRACT

A printed wiring board includes a first circuit board having a first surface and a second surface on the opposite side with respect to the first surface, and a second circuit board having a third surface and a fourth surface on the opposite side with respect to the third surface and having a mounting area on the third surface of the second circuit board. The first circuit board is laminated on the third surface of the second circuit board such that the first surface of the first circuit board faces the third surface of the second circuit board, and the first circuit board includes reinforcing material and has an opening portion exposing the mounting area of the second circuit board.

20 Claims, 8 Drawing Sheets

(51) Int. Cl.
*H01L 23/498* (2006.01)
*H05K 3/46* (2006.01)
*H01L 25/10* (2006.01)
H05K 1/02 (2006.01)
H01L 23/00 (2006.01)

(52) U.S. Cl.
CPC ............... *H01L 2224/81464* (2013.01); *H01L 2225/1023* (2013.01); *H01L 2225/1058* (2013.01); *H01L 2225/1088* (2013.01); *H01L 2924/15153* (2013.01); *H05K 1/0271* (2013.01); *H05K 2201/09827* (2013.01); *H05K 2201/10674* (2013.01)

(56) References Cited

U.S. PATENT DOCUMENTS

2003/0137056 A1* 7/2003 Taniguchi ......... H01L 23/49827
257/774
2012/0212919 A1* 8/2012 Mano .................... H05K 1/185
361/782

* cited by examiner

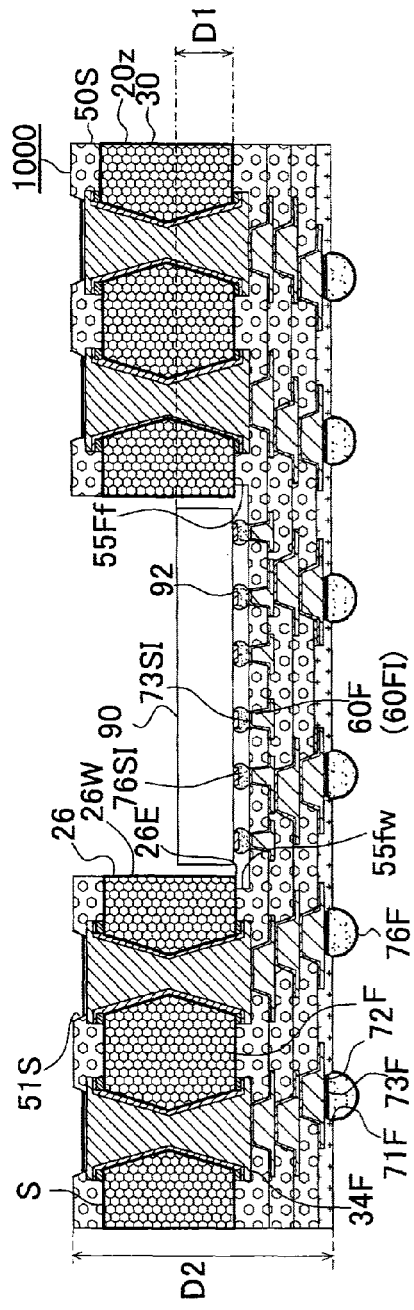
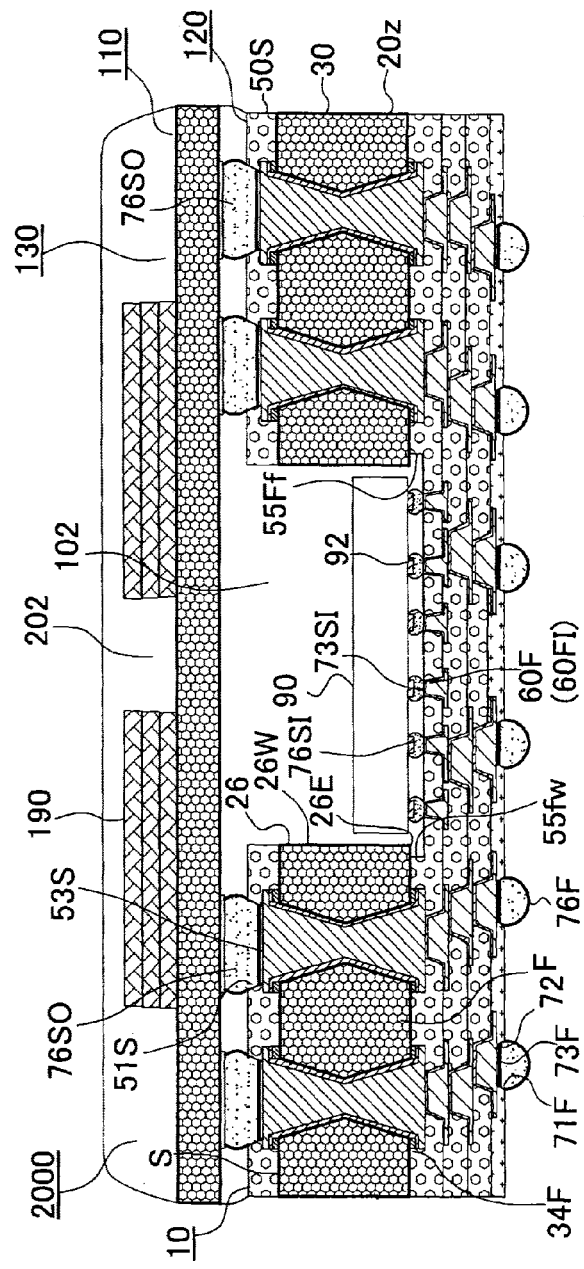
FIG. 2A
FIG. 2B

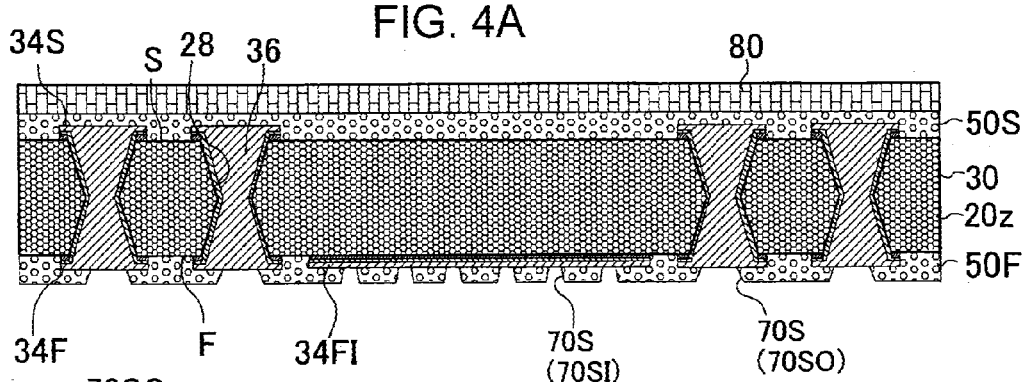
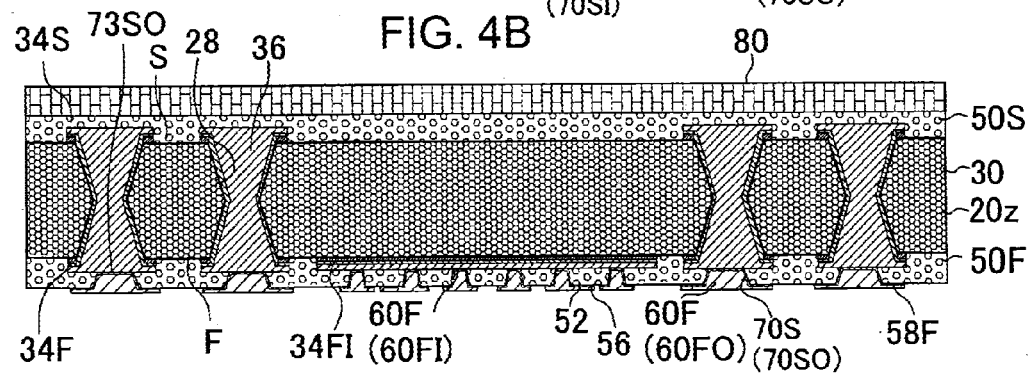
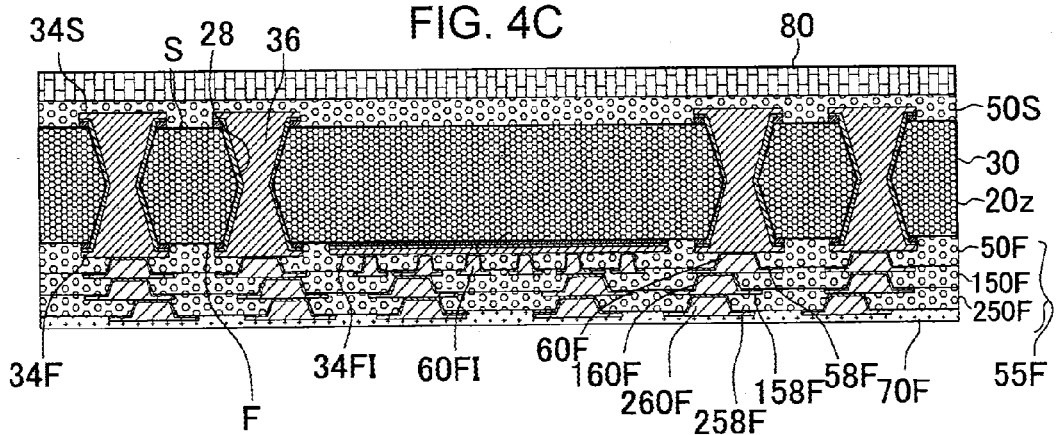
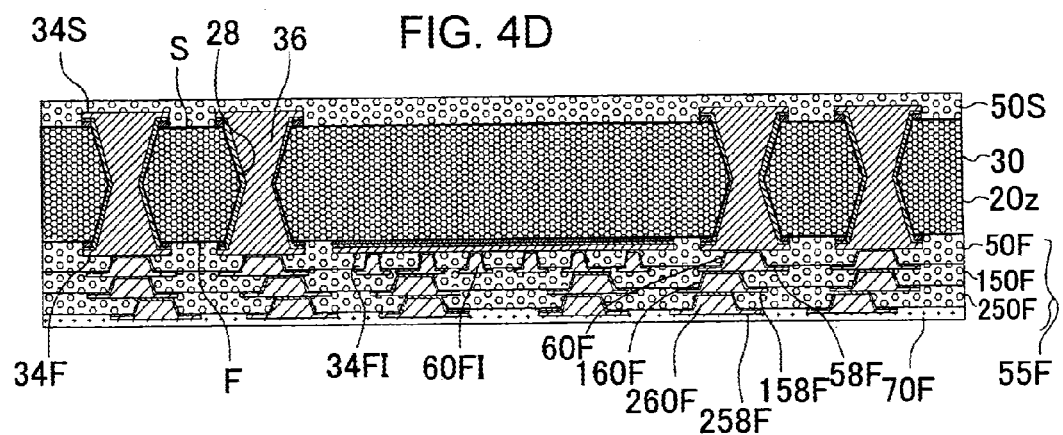

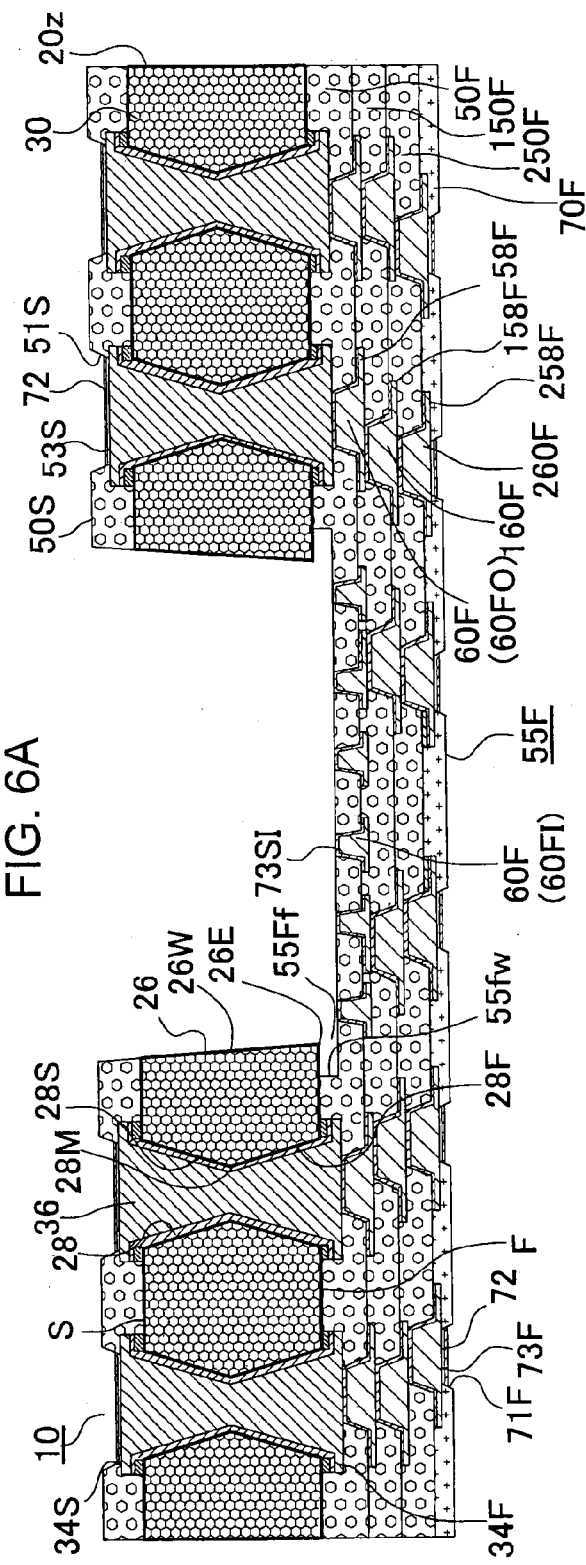
FIG. 6A
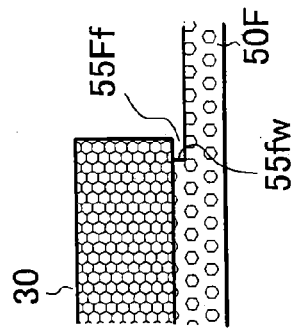
FIG. 6C
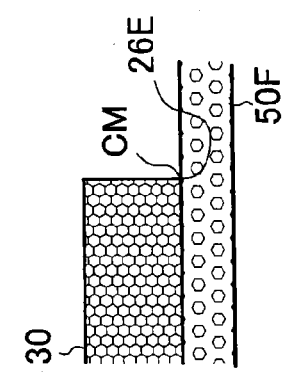
FIG. 6D
FIG. 6B

PRINTED WIRING BOARD

CROSS-REFERENCE TO RELATED APPLICATIONS

The present application is based upon and claims the benefit of priority to Japanese Patent Application No. 2014-124045, filed Jun. 17, 2014, the entire contents of which are incorporated herein by reference.

BACKGROUND OF THE INVENTION

Field of the Invention

The present invention relates to a printed wiring board made up of a second circuit board having a mounting area and a first circuit board having an opening to expose the mounting area.

Description of Background Art

JP2007-123524A describes a wiring board with a built-in electronic component. According to JP2007-123524A, the wiring board with a built-in electronic component has a coreless substrate and a resin layer. Through vias and an accommodation portion to accommodate a semiconductor chip are formed in the resin layer. The entire contents of this publication are incorporated herein by reference.

SUMMARY OF THE INVENTION

According to one aspect of the present invention, a printed wiring board includes a first circuit board having a first surface and a second surface on the opposite side with respect to the first surface, and a second circuit board having a third surface and a fourth surface on the opposite side with respect to the third surface and having a mounting area on the third surface of the second circuit board. The first circuit board is laminated on the third surface of the second circuit board such that the first surface of the first circuit board faces the third surface of the second circuit board, and the first circuit board includes reinforcing material and has an opening portion exposing the mounting area of the second circuit board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B are cross-sectional views showing applied examples of the printed wiring board according to the embodiment;

FIG. 4A-4D are views of steps showing the method for manufacturing a printed wiring board according to the embodiment;

FIG. 6A shows a cross-sectional view of a printed wiring board according to a modified example of the embodiment;

FIG. 6B is a schematic view showing a penetrating hole;

FIG. 6C is a view showing a contact point;

FIG. 6D is a view showing a recessed portion;

DETAILED DESCRIPTION OF THE EMBODIMENTS

Figure 1A:
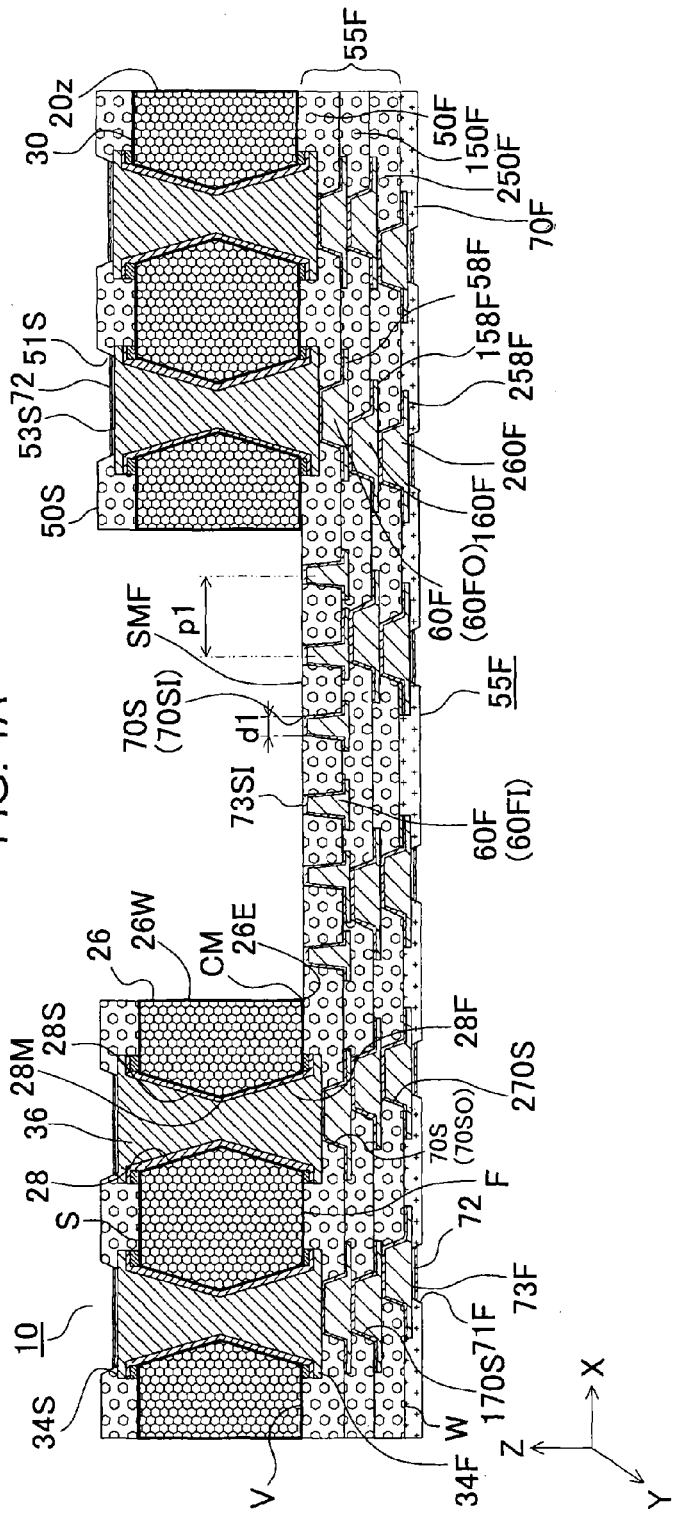
FIG. 1A shows a cross-sectional view of a printed wiring board according to an embodiment of the present invention.

The embodiments will now be described with reference to the accompanying drawings, wherein like reference numerals designate corresponding or identical elements throughout the various drawings.

Embodiment

Figure 8A:
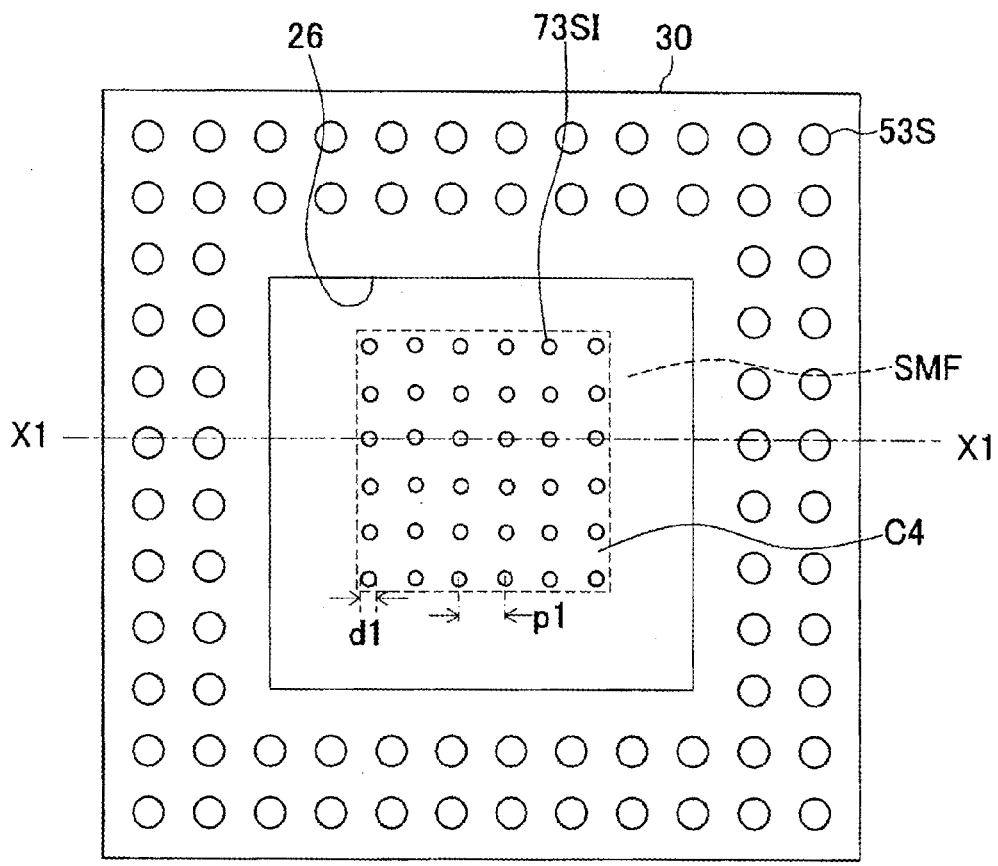
FIG. 8A is a plan view showing a first circuit board and a mounting area exposed through an opening of the first circuit board.

FIG. 1A shows a cross-sectional view of a printed wiring board according to an embodiment of the present invention. FIG. 8A is a plan view of the printed wiring board, showing first circuit board 30 and mounting area (SMF) exposed through opening 26 of the first circuit board. The cross section taken at (X1-X1) in FIG. 8A is shown in FIG. 1A. FIG. 2A shows a first applied example 1000 of printed wiring board 10 of the embodiment. First applied example 1000 is a first package substrate.

As shown in FIG. 1A, printed wiring board 10 of the embodiment is provided with first circuit board 30 having first surface (F) and second surface (S) opposite first surface (F) along with second circuit board (55F) having third surface (V) and fourth surface (W) opposite third surface (V). Opening 26 is formed at an approximate center of the first circuit board. Opening 26 penetrates through the first circuit board. Mounting area (SMF) is formed on third surface (V) of second circuit board (55F), and the mounting area is exposed by opening 26 of the first circuit board. First circuit board 30 is laminated on second circuit board (55F).

As shown in FIG. 8A, printed wiring board 10 is provided with pads (second pads) (53S) formed on the second surface of the first circuit board, along with pads (first pads) (73SI) formed on mounting area (SMF) of the second circuit board. First pads (73SI) are for mounting electronic component 90 such as an IC chip. A C4 pad group is formed with multiple pads (73SI). A C4 pad group is formed inside the dotted lines in FIG. 8A and positioned at an approximate center of second circuit board (55F). Second pads (53S) are for mounting second package substrate 130 shown in FIG. 2B. Second pads (53S) are formed on the periphery of printed wiring board 10.

As shown in FIG. 1A, first circuit board 30 is mounted on third surface (V) of second circuit board (55F). The first circuit board is formed with insulative substrate (20z) having first surface (F) and second surface (S) opposite first surface (F), first conductive layer (34F) formed on first surface (F) of insulative substrate (20z), and second conductive layer (34S) formed on the second surface of insulative substrate (20z). The first surface of the first circuit board corresponds to the first surface of the insulative substrate, and the second surface of the first circuit board corresponds to the second surface of the insulative substrate. First circuit board 30 is further provided with through-hole conductors 36 that connect first conductive layer (34F) and second conductive layer (34S). Through-hole conductor 36 is formed in penetrating hole 28 that penetrates through first circuit board 30. Penetrating holes 28 are each made up of first opening portion (28F) having first opening (28FO) on first surface (F) of first circuit board 30 and second opening portion (28S) having second opening (28SO) on second surface (S). The first opening portion tapers from the first surface toward the second surface, while the second opening portion tapers from the second surface toward the first surface. The first opening portion and the second opening portion are joined at connection portion (28M). A penetrating hole is shaped like an hourglass. First circuit board 30 shown in FIG. 1A may be manufactured by a method described in U.S. Pat. No. 7,786,390, for example. The contents of U.S. Pat. No. 7,786,390 are incorporated herein by reference. Conductive layers (34F, 34S) of first circuit board 30 include multiple conductive circuits (not shown) and lands of through-hole conductors formed around through-hole conductors 36.

Insulative substrate (20z) is made of reinforcing material and resin. Insulative substrate (20z) may further contain inorganic particles. Examples of reinforcing material are glass fibers, glass cloth and aramid fibers. Examples of inorganic particles are silica and alumina particles. The resin layers in JP2007-123524A do not include reinforcing material. By contrast, since insulative substrate (20z) of first circuit board 30 contains reinforcing material, the strength and rigidity of the first circuit board are high. The degree of warping is small in the printed wiring board of the embodiment. According to the embodiment, the degree of warping caused by heat cycles is small. Thus, at contact point (CM) connecting the second circuit board and corner portion (26E) of the first circuit board, there is less stress. Cracking originating at the contact point is less likely to occur in the second circuit board. Contact point (CM) and corner portion (26E) are shown in FIGS. 1A and 6C.

Printed wiring board 10 may have upper solder-resist layer (50S) formed on the second surface (S) of first circuit board 30 and second conductive layer (34S). Opening 26 penetrates through first circuit board 30 and upper solder-resist layer (50S). Openings (51S) are formed in upper solder-resist layer (50S) to expose second pads (53S). A resin insulation layer may be formed between second surface (S) of insulative substrate (20z) and upper solder-resist layer (50S). In such a structure, opening 26 penetrates through first circuit board 30, upper solder-resist layer (50S) and the resin insulation layer.

Second circuit board (55F) shown in FIG. 1A has conductive layers (58F, 158F, 258F) and resin insulation layers (50F, 150F, 250F), which are alternately laminated respectively. Second circuit board (55F) is further provided with via conductors (60F, 160F, 260F) which penetrate through their respective resin insulation layers.

The second circuit board has third surface (V) and fourth surface (W) opposite third surface (V). Third surface (V) of the second circuit board faces first surface (F) of the first circuit board. First surface (F) of the first circuit board is in contact with third surface (V) of the second circuit board. Fourth surface (W) of the second circuit board is the lower surface of the resin insulation layer furthermost from the first circuit board. In each resin insulation layer, the upper surface is the surface closer to the first circuit board, and the lower surface is opposite the upper surface. In FIG. 1A, third surface (V) is the upper surface of resin insulation layer (50F) (first resin insulation layer), and fourth surface (W) is the lower surface of resin insulation layer (250F) (third resin insulation layer). When the second circuit board has only one resin insulation layer (50F), third surface (V) is the upper surface of resin insulation layer (50F), and fourth surface (W) is the lower surface of resin insulation layer (50F).

Each resin insulation layer of the second circuit board is made of resin and inorganic particles. In addition, resin insulation layers (50F, 150F, 250F) may each contain reinforcing material such as glass cloth. By setting resin insulation layers (50F, 150F, 250F) to contain reinforcing material, cracking is suppressed in the second circuit board. Openings in each resin insulation layer taper from the lower surface toward the upper surface.

Via-conductor openings (70S, 170S, 270S) are formed in their respective resin insulation layers, and each opening tapers from the fourth surface (W) side toward the third surface (V) side.

Via conductors (60F, 160F, 260F) are formed in the openings of their respective resin insulation layers. Sidewalls of via conductors taper from the fourth surface (W) side toward the third surface (V) side. Sidewalls of via conductors formed in openings in their respective resin layers taper from the lower surface to the upper surface. Adjacent conductive layers are connected by via conductors.

First resin insulation layer (50F) is formed on first surface (F) of first circuit board 30 and on first conductive layer (34F). Conductive layer (58F) (first conductive layer in the second circuit board) is formed on first resin insulation layer (50F). Second circuit board (55F) has first via conductors (60F) that penetrate through the first resin insulation layer. First via conductors (60F) include connection via conductors (60FO) that connect conductive layer (58F) and first conductive layer (34F) and mounting via conductors (60FI) for mounting an electronic component. The bottom of a mounting via conductor (60FI) is exposed in opening 26 of the first circuit board and in an opening (70SI) of resin insulation layer (50F). Connection via conductors (60FO) may each be connected directly to land (36L) of a through-hole conductor of the first circuit board. The land of a through-hole conductor covers the through-hole conductor and is a conductive circuit included in the first conductive layer.

Second resin insulation layer (150F) is formed on resin insulation layer (50F) and conductive layer (58F). Conductive layer (158F) (second conductive layer in the second circuit board) is formed on second resin insulation layer (150F). Conductive layer (158F) and conductive layer (58F) are connected by second via conductors (160F) penetrating through resin insulation layer (150F). Third resin insulation layer (250F) is formed on resin insulation layer (150F) and conductive layer (158F). Resin insulation layer (250F) is the lowermost resin insulation layer. Conductive layer (258F) (third conductive layer in the second circuit board) is formed on third resin insulation layer (250F). Conductive layer (258F) is the lowermost conductive layer. Conductive layer (258F) and conductive layer (158F) are connected by third via conductors (260F), which penetrate through resin insulation layer (250F). Second circuit board (55F) is made up of resin insulation layers (50F, 150F, 250F), conductive layers (58F, 158F, 258F) and via conductors (60F, 160F, 260F). It is also an option to form second circuit board (55F) with resin insulation layer (50F), conductive layer (58F) and via conductors (60F).

As shown in FIGS. 1 and 8, the bottom of a mounting via conductor (60FI) that penetrates through resin insulation layer (50F) (first resin insulation layer) is exposed so as to work as a first pad (73SI) (C4 pad). First pads are formed in the mounting area of the second circuit board.

First pads (73SI) and mounting via conductors (60FI) exposed through opening 26 of the first circuit board may be formed as shown in examples below.

Figure 1D:
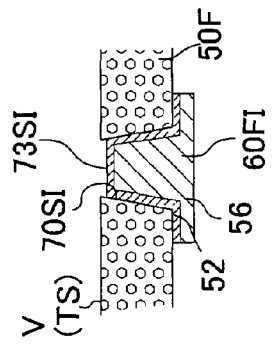
FIGS. 1B, 1C and 1D show examples of a first pad and a mounting via conductor.
Figure 1C:
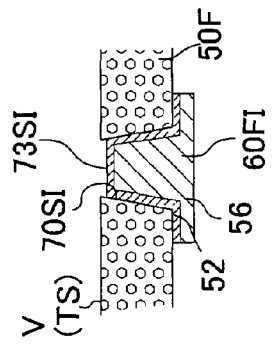
Figure 1B:
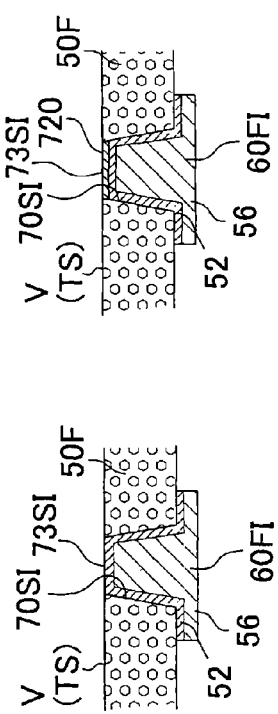

FIG. 1B shows a first example. In FIG. 1B, a mounting via conductor (60FI) is made up of seed layer 52 formed on the sidewall of a first via-conductor opening (70SI) and of electrolytic plated film 56 formed on seed layer 52. The seed layer 52 exposed in opening 26 forms the bottom of a mounting via conductor and works as a first pad. In the first example, the bottom is made flush with third surface (V) of resin insulation layer (50F) (first resin insulation layer).

FIG. 1C shows a second example. In FIG. 1C, a mounting via conductor is made of metal film 720, seed layer 52 on metal film 720 and electrolytic plated film 56 on seed layer 52 formed in a via-conductor opening (70SI). Seed layer 52 is formed on metal film 720 and on the sidewall of via-conductor opening (70SI). The metal film 720 is exposed in opening 26 and forms the bottom of a mounting via conductor. In the second example, the bottom is made flush with third surface (V) of resin insulation layer (50F) (first resin insulation layer). The exposed metal film works as a first pad. The metal film is for preventing oxidation of the pad, and is made of a film containing a metal such as Au, Sn or Pd.

FIG. 1D shows a third example. A mounting via conductor of the third example is made of seed layer 52 and electrolytic plated film 56 on the seed layer, the same as in the first example. However, the bottom of a mounting via conductor is recessed from third surface (V) of resin insulation layer (50F) (first resin insulation layer) in the third example. The seed layer works as a first pad in the third example. The bottom shown in the second example may also be recessed from the third surface of first resin insulation layer (50F), the same as in the third example.

Figure 8B:
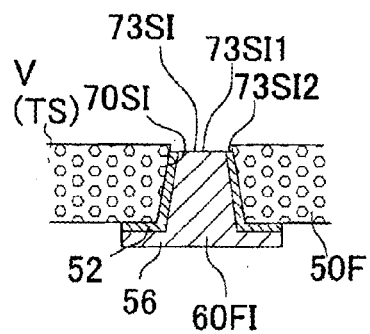
FIGS. 8B, 8C and 8D show examples of a first pad and a mounting via conductor.
Figure 8C:
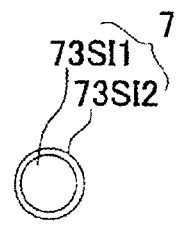

FIGS. 8B and 8C show a fourth example. FIG. 8B is a cross-sectional view. FIG. 8C is a plan view, which shows bottom (73SI) of a mounting via conductor in the fourth example. As shown in FIG. 8B, a mounting via conductor is made of seed layer 52 and electrolytic plated film 56 on the seed layer. The bottom of a mounting via conductor in the fourth example is recessed from the third surface. In the fourth example, the bottom of a mounting via conductor is made of electrolytic plated film 56 and seed layer 52 surrounding electrolytic plated film 56. The seed layer is formed on the sidewall of a first via-conductor opening (70SI). Electrolytic plated film 56 is formed on the seed layer. In the fourth example, seed layer (73SI2) and electrolytic plated film (73SI1) form the bottom of a mounting via conductor and are made flush.

Figure 8D:
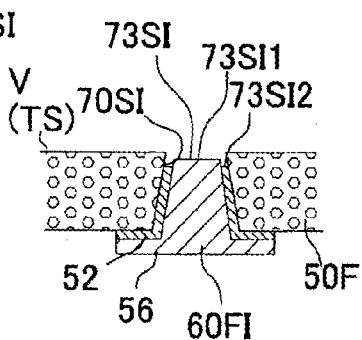

FIG. 8D shows a fifth example. A mounting via conductor of the fifth example is formed with seed layer 52 and electrolytic plated film 56 on the seed layer. The bottom of a mounting via conductor in the fifth example is made of electrolytic plated film 56 and seed layer 52 surrounding electrolytic plated film 56. In addition, the bottom of a mounting via conductor in the fifth example is recessed from the third surface. Moreover, the seed layer 52 at bottom (73SI2) of a mounting via conductor in the fifth example is recessed from electrolytic plated film 56 at bottom (73SI1).

Solder bump (76SI) may be formed on a first pad for connection with an electronic component. According to the fifth example, the surface area of a pad is made greater. Thus, connection reliability is high between a first pad and solder bump (76SI) on the first pad. When the bottom is recessed from the third surface of first resin insulation layer (50F), first resin insulation layer (50F) works as a dam so that insulation reliability is enhanced between solder bumps (76SI) on the first pads. An example of electrolytic plated film 56 is electrolytic copper-plated film and an example of a seed layer is electroless copper-plated film.

When a pad for mounting an electronic component is made of the land of a via conductor formed on a resin insulation layer, the land protrudes from the resin insulation layer and is not embedded in the resin insulation layer. A land that forms a pad may cover the via conductor. In addition, the size of a land forming a pad may be set greater than the size of the via conductor. By contrast, in the present embodiment, pad (73SI) (first pad) for mounting electronic component 90 is the bottom of a mounting via conductor (60FI). A first pad in the printed wiring board according to the embodiment does not have a land for mounting an electronic component. According to the present embodiment, the size of a pad for mounting an electronic component is made smaller. Subsequently, the pitch of pads is narrower. According to the embodiment, the size of a printed wiring board is reduced. The degree of warping of the printed wiring board is made smaller. Connection reliability is enhanced between the printed wiring board and the mounted electronic component. A printed wiring board capable of mounting an electronic component at high yield is provided.

In the printed wiring board of the embodiment, a first via-conductor opening tapers from the lower surface toward the upper surface of a resin insulation layer. Thus, the size of a pad is made even smaller, and the pitch of first pads is further narrowed. The size of a printed wiring board is made smaller. A high-functional electronic component can be mounted on the printed wiring board.

As shown in FIG. 8A, diameter (d1) of first pad (73SI) is 40 μm to 80 μm and pitch (p1) is 110 μm to 170 μm. Pitch (p1) is the distance between the centers of adjacent first pads (73SI). Pitch (p1) is the distance between the gravity centers of adjacent pads (73SI).

The land forming a pad in JP2007-123524A is formed on a resin insulation layer, and protrudes from the resin insulation layer. By contrast, a first pad of the embodiment is embedded in a resin insulation layer. When electronic components having the same thickness are mounted on circuit boards of JP2007-123524A and the embodiment respectively, and when the distance (D1) (see FIG. 2A) from first surface (F) of a first circuit board to the upper surface of the electronic component is compared in the embodiment and JP2007-123524A, the distance (D1) in the embodiment is smaller than the distance in JP2007-123524A. According to the embodiment, the thickness of the first circuit board is made thinner. Thus, according to the embodiment, thickness (D2) of a printed wiring board (see FIG. 2A) is made thinner. The distance (D1) in JP2007-123524A corresponds to the distance between the upper surface (28A) of the prepreg resin layer 28 (shown in FIG. 2 of JP2007-123524A) and the surface (14B) of the semiconductor chip 14.

When the third surface that forms the mounting area is recessed from the first surface of the first circuit board, distance (D1) is further reduced. Thickness (D2) of the printed wiring board is made thinner.

Lower solder-resist layer (70F) are formed on the lowermost conductive layer (258F) of the second circuit board and on the lowermost resin insulation layer (250F). Lower solder-resist layer (70F) has openings (71F) for exposing conductive layer (258F) and via conductors (260F). Conductors exposed from openings (71F) work as pads (73F).

Pads (73F) will be connected with a motherboard, for example. Solder bumps (76F) are formed on pads (73F).

As shown in FIG. 2A, electronic component 90 such as an IC chip (logic chip) is mounted on printed wiring board 10 through solder bumps (76SI) formed on first pads (C4 pads) (73SI). First package substrate 1000 is completed. Electronic component 90 is accommodated in opening 26 of the first circuit board.

Second package substrate 130 is mounted on first package substrate 1000 through connector members (76SO) on second pads (53S) of the first circuit board. POP board 2000 is completed as shown in FIG. 2B. Second package substrate 130 is provided with upper substrate 110 and electronic component 190 such as a memory mounted on the upper substrate. Molding resin 102 is formed between first package substrate 120 and second package substrate 130. Molding resin 202 is formed to encapsulate electronic component 190 on upper substrate 110. In FIG. 2B, connector members (76SO) connecting the first package substrate and second package substrate are solder bumps. Other than solder bumps, examples of connector members are metal posts such as plating posts and pins. Plating posts and pins are formed in a cylindrical shape. A right circular cylinder is preferred.

In the printed wiring board of the present embodiment, the amount of resin on the first surface of the first circuit board is greater than that on the second surface of the first circuit board. POP board 2000 shown in FIG. 2B is manufactured by mounting a second package substrate on such a printed wiring board. In a POP board, the difference in the amounts of resin on the first surface and on the second surface of the first circuit board is made smaller. As a result, the degree of warping in the POP board is less during heat cycles. According to the embodiment, a POP board with high reliability is provided.

FIG. 6A shows a modified example of the embodiment. In a printed wiring board of the modified example, opening 26 tapers from second surface (S) toward first surface (F). Sidewall (26W) of the first circuit board exposed in opening 26 tapers from second surface (S) toward first surface (F). By contrast, via-conductor openings formed in the second circuit board taper from the fourth-surface side toward the third-surface side. Via-conductor openings formed in each resin insulation layer taper from the lower surface toward the upper surface. Openings formed in the second circuit board and opening 26 formed in the first circuit board taper in opposite directions. Because the direction of openings is opposite, warping in the second circuit board is offset with warping in the first circuit board. Accordingly, the degree of warping is smaller in the printed wiring board made up of such first and second circuit boards.

Method for Manufacturing Printed Wiring Board of the Embodiment

FIG. 3-5 show a method for manufacturing printed wiring board 10 of the embodiment.

Figure 3A:
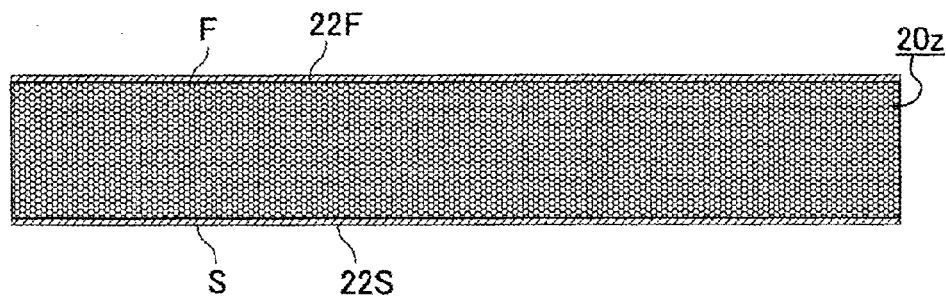
FIG. 3A-3E are views of steps showing a method for manufacturing a printed wiring board according to the embodiment.

A starting substrate is prepared. A starting substrate is formed with insulative substrate (20z) and copper foils (22F, 22S) laminated respectively on both surfaces of insulative substrate (20z) (FIG. 3A). The insulative substrate contains reinforcing material, resin and inorganic particles. Examples of reinforcing material are glass cloth, glass fibers and aramid fibers. Examples of the resin are epoxy resin and bismaleimide triazine (BT) resin. The insulative substrate has first surface (F) and second surface (S) opposite the first surface. Copper foil (22F) laminated on first surface (F) of the insulative substrate is first copper foil, and copper foil (22S) laminated on second surface (S) of the insulative substrate is second copper foil.

Figure 3B:
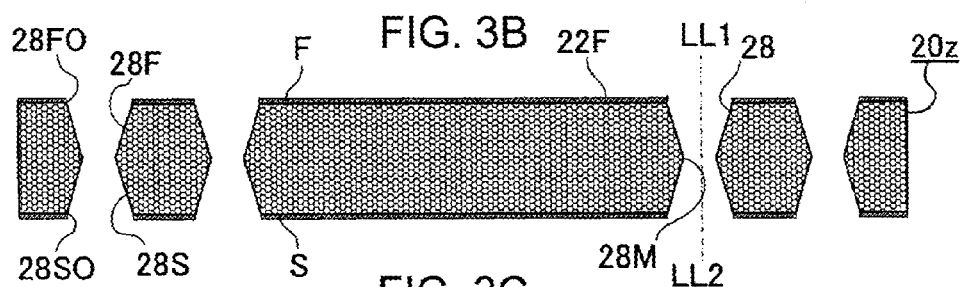
Figure 3C:
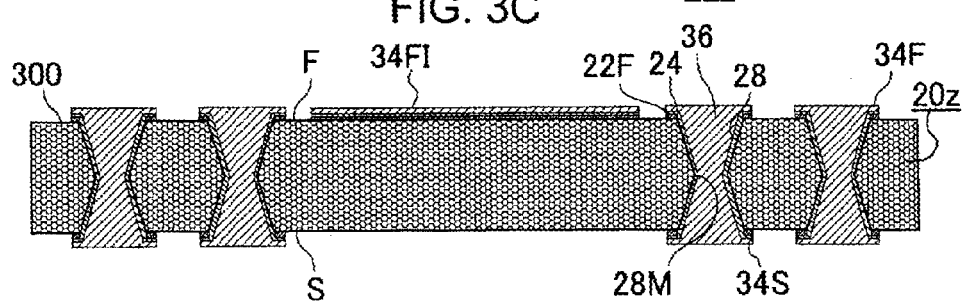

A $CO_2$ laser is irradiated at first copper foil (22F) of the starting substrate. First opening portion (28F) is formed on the first-surface (F) side of insulative substrate (20z). A $CO_2$ laser is further irradiated at second copper foil (22S). Second opening portion (28S) is formed on the second surface (S) side to be connected to first opening portion (28F). First opening portion (28F) and second opening portion (28S) are joined at connection plane (28CF). Connection plane (28CF) is shown in FIG. 6B. Connection portion (28M) is formed where the sidewall of the first opening portion intersects with the sidewall of the second opening portion. The laser is irradiated so that axis (LL1) of the first opening portion corresponds to axis (LL2) of the second opening portion. Penetrating hole 28 for a through-hole conductor is formed (FIG. 3B). The first opening portion tapers from first surface (F) toward second surface (S), whereas the second opening portion tapers from second surface (S) toward the first surface (F). The first opening portion has first opening (28FO) on the first surface, and the second opening portion has second opening (28SO) on the second surface.

Electroless plated film is formed on the first and second copper foils and on the sidewall of penetrating hole 28. Then, electrolytic plated film is formed on the electroless plated film. Plated film 24 is formed in the penetrating hole, being made of electroless plated film and electrolytic plated film formed on the electroless plated film. Simultaneously, plated film 24 is formed on the first and second surfaces of the insulative substrate. Penetrating hole 28 is filled with electrolytic plated film. Etching resist is formed on plated film 24. Plated film 24 and copper foils (22F, 22S) exposed from the etching resist are removed. The etching resist is removed. First conductive layer (34F) is formed on the first surface of the insulative substrate, and second conductive layer (34S) is formed on the second surface of the insulative substrate. First conductive layer (34F) includes dummy pattern (34FI) for forming opening 26. Through-hole conductor 36 is formed in penetrating hole 28 and connects the first conductive layer and the second conductive layer. Connection portion (28M) of a penetrating hole is the narrowest portion of the through-hole conductor. Intermediate substrate 300 is obtained, being formed with an insulative substrate having penetrating hole 28, through-hole conductor 36 formed in penetrating hole 28, first conductive layer (34F) formed on the first surface of the insulative substrate, and second conductive layer (34S) formed on the second surface of the insulative substrate (FIG. 1C). Intermediate substrate 300 may be manufactured by a method described in U.S. Pat. No. 7,786,390. The intermediate substrate has a first surface and a second surface. The first surface of the intermediate substrate corresponds to the first surface of the insulative substrate, and the second surface of the intermediate substrate corresponds to the second surface of the insulative substrate.

Figure 7A:
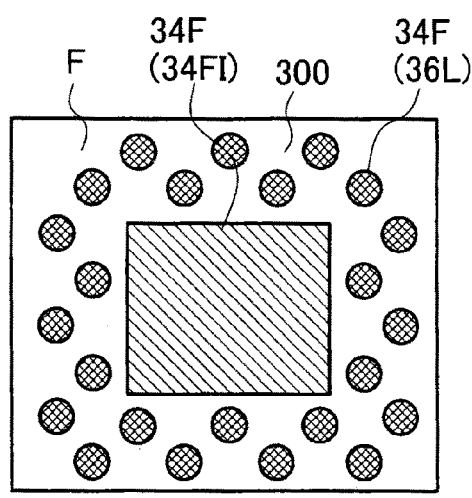
FIG. 7A is a plan view of the printed wiring board.

FIG. 7A shows a plan view of intermediate substrate 300. FIG. 7A is obtained by observing the intermediate substrate from the first-conductive-layer side. FIG. 7A shows the first conductive layer (34F) and the first surface of insulative substrate (20z) exposed through the first conductive layer. At the approximate center of the first surface of the insulative substrate, dummy pattern (34FI) is formed. Diagonal lines are drawn in dummy pattern (34FI). Dummy pattern (34FI) covers a predetermined region on the first surface of insulative substrate (20z). Dummy pattern (34FI) is a so-called solid pattern. Around the dummy pattern, lands (36L) of through-hole conductors 36 are shown. Diagonal lines in two different angles are drawn in lands (36L). FIG. 7B shows the positional relationship and sizes of opening 26 and dummy pattern (34FI). The periphery of dummy pattern (34FI) is shown by solid lines, and the periphery of opening 26 is shown by dotted lines. The dotted lines indicate the periphery of opening 26 to be formed on the dummy pattern. As shown in FIG. 7B, the size of dummy pattern (34FI) is greater than the size of opening 26. In addition, the periphery of dummy pattern (34FI) is positioned on the outer side of the periphery of opening 26.

Figure 3D:
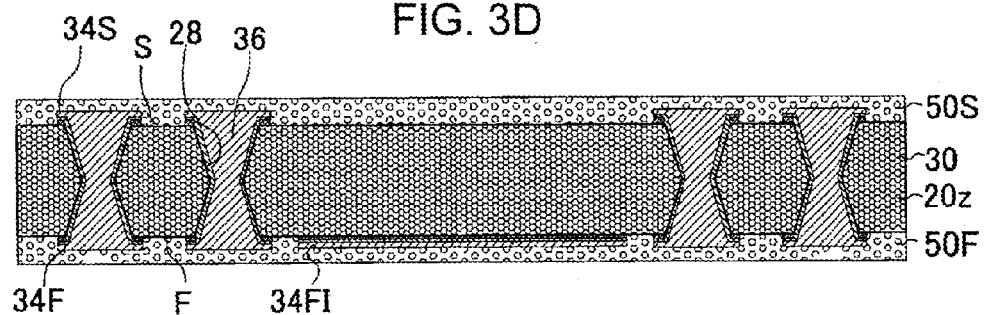

First resin insulation layer (50F) is formed through hot pressing on first surface (F) of intermediate substrate 300. Resin insulation layer (50S) (upper solder-resist layer) is formed on second surface (S) of the intermediate substrate (FIG. 3D). First resin insulation layer (50F) and upper solder-resist layer (50S) are made of a thermosetting resin. Resin insulation layers (50F, 50S) contain resin such as epoxy resin and inorganic particles made of silica, for example. Resin insulation layers (50F, 50S) may further contain reinforcing material such as glass cloth.

Figure 3E:
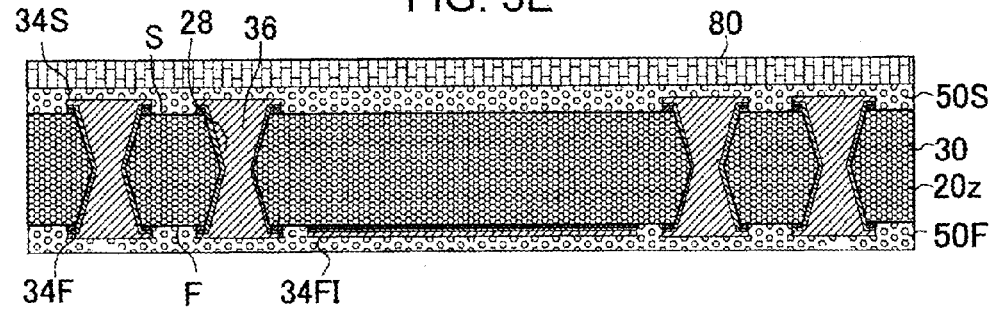

PET film 80 is laminated on resin insulation layer (50S) (FIG. 3E).

Next, first via-conductor openings (70S) (70SI, 70SO) are formed in resin insulation layer (50F) to reach the first conductive layer (FIG. 4A). Via-conductor openings (70S) include opening (70SI) that reaches dummy pattern (34FI) and opening (70SO) that reaches the first conductive layer excluding the dummy pattern. Opening (70SI) is for forming a mounting via conductor, and opening (70SO) is for forming a connection via conductor. Opening (70SO) reaches, for example, land (36L) of a through-hole conductor. The land of a through-hole conductor is made up of the conductor formed directly on the through-hole conductor and the conductor formed around the through-hole conductor. Conductive layer (58F) is formed on resin insulation layer (50F) using a semi-additive method. Simultaneously, via conductors (60F) are formed in openings (70S) (FIG. 4B). First via conductor (60FO) (connection via conductor) is formed in opening (70SO) to be connected to a through-hole conductor. First via conductor (60FI) (mounting via conductor) is formed in opening (70SI) to form a C4 pad. First via conductors (60F) each have a bottom. The bottom of a connection via conductor is in contact with the land of a through-hole conductor. The bottom of a mounting via conductor is formed on the dummy pattern. The bottom of a mounting via conductor is in contact with the dummy pattern.

Metal film may be formed on the dummy pattern exposed through opening (70SI). The metal film works as a C4 pad. A metal other than copper is used for forming metal film, and such metal film prevents oxidation of a C4 pad (first pad). Examples of metal film are gold, palladium, and tin. Nickel may also be formed between the metal film and a C4 pad.

Second resin insulation layer (150F) is formed through hot pressing on resin insulation layer (50F) and conductive layer (58F). Second via-conductor opening (170S) is formed in second resin insulation layer (150F). Second resin insulation layer (150F) is made of a thermosetting resin. Conductive layer (158F) is formed on second resin insulation layer (150F). Simultaneously, second via conductor (160F) is formed in a second via-conductor opening. Conductive layer (158F) and via conductor (160F) are formed using a semi-additive method.

Third resin insulation layer (250F), conductive layer (258F) and third via conductor (260F) are formed by the same methods as described in the above paragraphs. Third resin insulation layer (250F) is made of a thermosetting resin. Resin insulation layers (50F, 150F, 250F) in the second circuit board are thermosetting resins.

Lower solder-resist layer (70F) is formed on third resin insulation layer (250F) and conductive layer (258F) (FIG. 4C). Lower solder-resist layer (70F) is made of a photo-curing resin and contains resin and inorganic particles. Lower solder-resist layer (70F) does not contain reinforcing material such as glass cloth.

Upper solder-resist layer (50S) is a thermosetting resin, and lower solder-resist layer (70F) is a photo-curing resin. Upper solder-resist layer (50S) contains reinforcing material, but lower solder-resist layer (70F) does not contain reinforcing material. Even if the amounts of resin differ on the first surface and on the second surface of the first circuit board, the imbalance in the resin amounts is mitigated. The degree of warping in the printed wiring board is reduced.

Film 80 is removed (FIG. 4D). Film 80 may be removed after opening 26 is formed. In such a case, a laser is irradiated at the first circuit board through the film and the upper solder-resist layer.

Figure 5A:
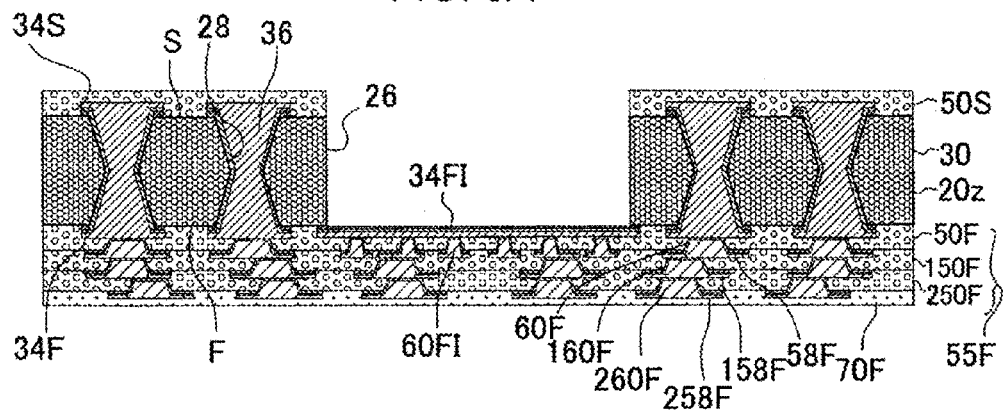
FIG. 5A-5C are views of steps showing the method for manufacturing a printed wiring board according to the embodiment.
Figure 5B:
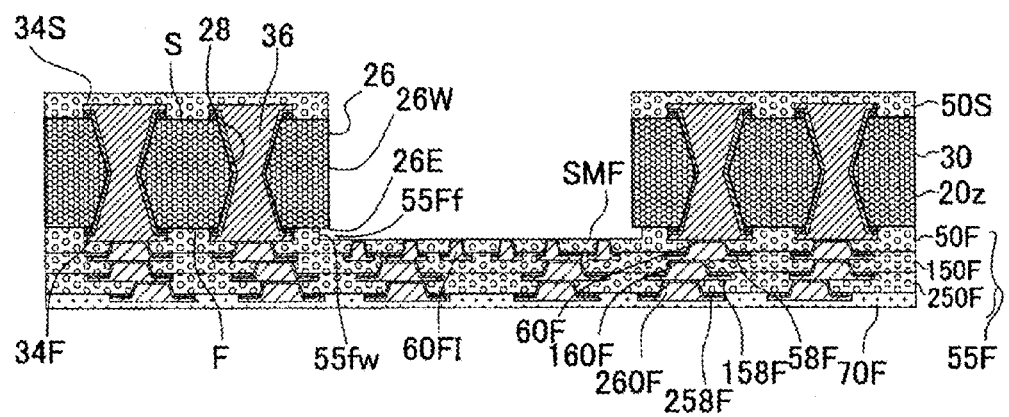
Figure 7C:
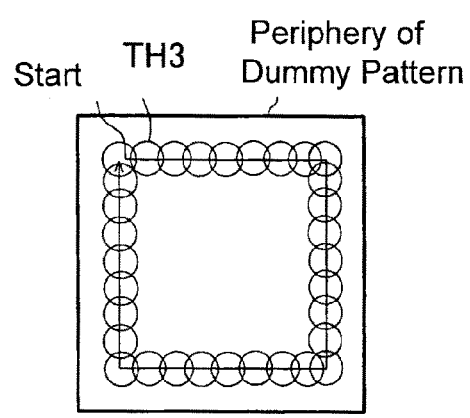
FIGS. 7C and 7D are views showing a method for forming an opening.
Figure 7B:
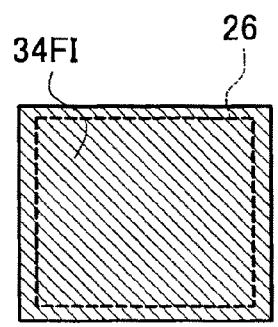
FIG. 7B is a plan view of a dummy pattern.
Figure 7D:
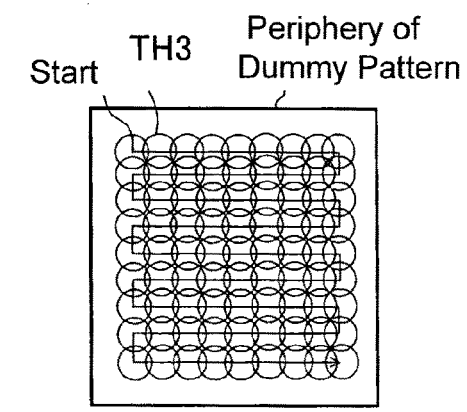

FIGS. 7C and 7D are plan views, showing the second surface of the insulative substrate projected on the dummy pattern at the same magnification. FIG. 7D shows an example of a method for forming opening 26. A laser is irradiated on the second surface of the insulative substrate through the upper solder resist layer. First, a laser is irradiated at the starting position in FIG. 7D. Laser beams penetrate through the insulative substrate and reach the dummy pattern. Then, laser irradiation positions move along the arrow shown in FIG. 7D so that the adjacent penetrating holes overlap each other. The insulative substrate positioned on the dummy pattern is removed. Opening 26 is formed to expose the dummy pattern (FIG. 5A). In the method shown in FIG. 7D, opening 26 is formed by multiple penetrating holes. By increasing the overlapping portions, the periphery of opening 26 is formed to be substantially straight. The dummy pattern exposed in opening 26 is etched away. The bottom of a first via conductor (60FI) that forms a C4 pad is exposed in opening 26 (FIG. 5B).

In the embodiment, the size of the dummy pattern is set greater than the size of opening 26. Then, the dummy pattern between the first circuit board and the second circuit board is removed. Thus, as shown in FIG. 5B, the mounting area is recessed from the first surface of the first circuit board. In addition, space (55Ff) (recessed portion) is formed between the first circuit board and the second circuit board.

FIG. 7C shows another method for forming an opening. In FIG. 7C, a laser is used to form a frame-shaped opening to reach the dummy pattern. An etching solution is filled in the frame opening so that the dummy pattern is dissolved. At that time, the dummy pattern sandwiched by the insulative substrate and the second circuit board is dissolved, and the insulative substrate in the frame opening is thereby peeled from the second circuit board. Accordingly, the insulative substrate in the frame opening is removed from the second circuit board. Opening 26 is formed and the bottom of a first via conductor (60FI) that forms a C4 pad is exposed therein (FIG. 5B).

By irradiating a laser on the PET film or the like laminated on resin insulation layer (50S), opening 26 is formed to penetrate through film 80, resin insulation layer (50S) and the first circuit board. After opening 26 is formed, film 80 is removed.

It is yet another option to form opening 26 by using a router.

When opening 26 is formed by the method shown in FIG. 7D, the dummy pattern made of copper is removed by etching. For example, when the bottom of a mounting via conductor is formed with metal film, dissolution of such a bottom is suppressed while the dummy pattern is etched away.

Using a laser, opening (51S) is formed in upper solder-resist layer (50S) to expose a pad (53S). In lower solder-resist layer (70F), opening (71F) to expose a pad (73F) is formed by exposure/developing treatment.

Figure 5C:
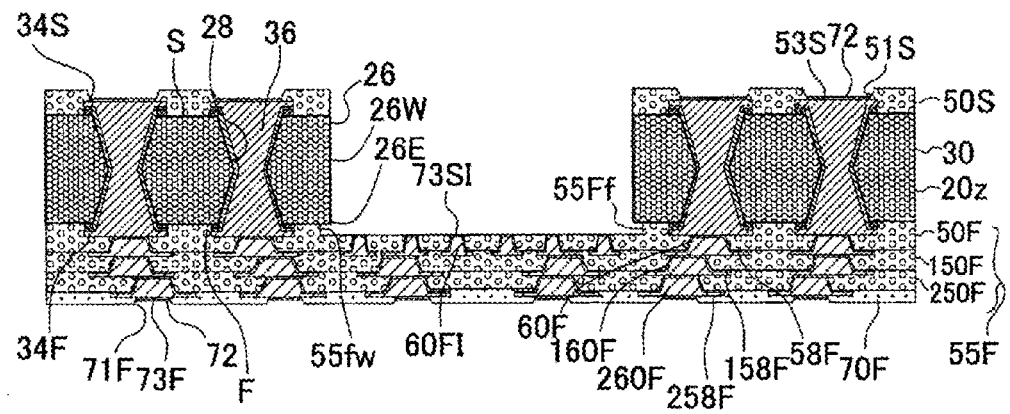

Protective film 72 is formed on pads (73F, 53S) and C4 pads (73SI) (FIG. 5C). Protective film is for preventing oxidation of pads. Protective film is formed using, for example, Ni/Au, Ni/Pd/Au, Pd/Au, or OSP (organic solderability preservative). The protective film is not formed on C4 pads.

Solder bumps (76F, 76SI, 76SO) are formed on pads (73F, 73SI, 53S) respectively.

Each resin insulation layer has an upper surface and a lower surface opposite the upper surface. The upper surface of each resin insulation layer is the surface closer to the first circuit board, and the lower surface of each resin insulation layer is the surface closer to the lower solder-resist layer. Via-conductor openings formed in each resin insulation layer taper from the lower surface toward the upper surface. Sidewalls of via conductors formed in via-conductor openings taper from the lower surface toward the upper surface as well. The via conductor has the bottom on its upper-surface side.

Conductive layers (58F, 158F, 258F) and via conductors (60F, 160F, 260F) are made of electroless copper-plated film 52 and electrolytic copper-plated film 56 formed on the electroless copper-plated film.

An IC chip is mounted on a printed wiring board through solder bumps (76SI) on C4 pads (73SI). A first package substrate (first applied example) is completed (FIG. 2A). The IC chip is accommodated in the opening. The IC chip does not protrude from opening 26. Second package substrate 130 is mounted on first package substrate 120 through solder bumps (76SO) (FIG. 2B). POP substrate 2000 (second applied example) is completed.

Figure 7E:
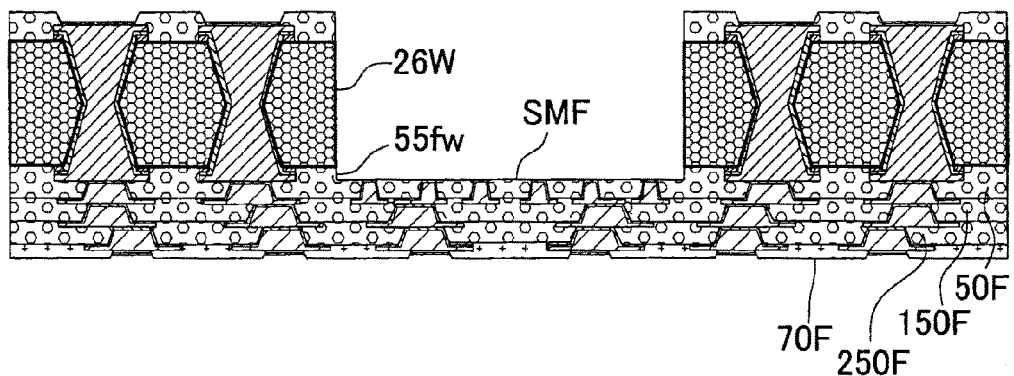
FIG. 7E shows a second modified example of the embodiment.

When the periphery of the dummy pattern corresponds to the periphery of opening 26 in the step shown in FIG. 5A, a printed wiring board without recessed portion (55Ff) is obtained (FIG. 7E). The printed wiring board shown in FIG. 7E is a second modified example. In FIG. 7E, sidewall (55fw) and sidewall (26W) of the first circuit board are positioned on substantially a straight line. FIG. 6C shows the contact point (CM) between the first circuit board and the second circuit board along with the first and second circuit boards near contact point (CM).

A first metal layer is formed on dummy pattern (34FI) exposed in opening (70SI), and a mounting via conductor (60FI) is formed on the first metal layer. When the material for the first metal layer is different from that of a mounting via conductor, the first metal layer can be selectively removed. The bottom of a mounting via conductor (60FI) is recessed from the third surface of resin insulation layer (50F). Metal film may be formed between the first metal layer and seed layer 52. In such a case, the metal film is exposed. The metal film is recessed from the third surface of the resin insulation layer. The metal film suppresses oxidation of pads. Examples of metal film are Au, Sn and Pd films.

When the bottom of a mounting via conductor is recessed from the third surface, distance (D1) shown in FIG. 2A is reduced. Accordingly, thickness (D2) of the printed wiring board shown in FIG. 2A is made thinner.

On the dummy pattern exposed from opening (70SI), a mounting via conductor made of seed layer 52 and electrolytic plating 56 is formed. Metal film may be formed between the dummy pattern and the seed layer. By removing only the dummy pattern, the bottom of a mounting via conductor (60FI) is exposed. The bottom of a mounting via conductor formed with a seed layer is made flush with the third surface of the resin insulation layer (50F). The bottom of a mounting via conductor formed with metal film is made flush with the third surface of resin insulation layer (50F). By removing the seed layer (the seed layer that forms the bottom) shown in FIG. 1B, the electrolytic plated film of the mounting via conductor forms the bottom of the mounting via conductor. The bottom of a mounting via conductor is recessed from the third surface of resin insulation layer (50F). When the etching rate of the seed layer is faster than the etching rate of the electrolytic plated film, the seed layer surrounding the electrolytic plated film is recessed from the electrolytic plated film. For example, when a seed layer is made of electroless copper-plated film, and an electrolytic plated film is made of electrolytic copper-plated film, the seed layer tends to be recessed from the electrolytic plated film.

A wiring board with a built-in electronic component may be formed with a coreless substrate and a resin layer having an accommodation portion to accommodate a semiconductor chip. The strength and rigidity of such a wiring board with a built-in electronic component are thought to be low. When the temperature of such a wiring board with a built-in electronic component is raised high during a reflow process or the like, the degree of warping is thought to increase and connection reliability between the wiring board with a built-in electronic component and the electronic component is thought to decrease because of heat cycles.

A printed wiring board according to an embodiment of the present invention enhances connection reliability between the printed wiring board and an electronic component mounted on the printed wiring board. A printed wiring board according to an embodiment of the present invention reduces the pitch of pads for mounting an electronic component. A printed wiring board according to an embodiment of the present invention is capable of mounting an electronic component at high yield.

A printed wiring board according to an embodiment of the present invention is formed with a second circuit board and a first circuit board: the second circuit board has a third surface with a mounting area and a fourth surface opposite the third surface, while the first circuit board, which is laminated on the third surface of the second circuit board, has a first surface and a second surface opposite the first surface along with an opening to expose the mounting area. The first surface of the first circuit board faces the third surface of the second circuit board, and the first circuit board contains reinforcing material.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a first circuit board having a first surface and a second surface on an opposite side with respect to the first surface; and
a second circuit board having a third surface and a fourth surface on an opposite side with respect to the third surface and having a mounting area on the third surface of the second circuit board, wherein the first circuit board is laminated on the third surface of the second circuit board such that the first surface of the first circuit board faces the third surface of the second circuit board, and the first circuit board comprises reinforcing material and has an opening portion exposing the mounting area of the second circuit board, the second circuit board comprises a first resin insulating layer having a plurality of first via openings extending from an upper surface to a lower surface of the first resin insulating layer, a first inner conductive layer formed on the lower surface of the first resin insulating layer, and a plurality of first via conductors formed in the plurality of first via openings of the first resin insulating layer, respectively, the upper surface of the first resin insulating layer is forming the third surface of the second circuit board, each of the first via conductors has a bottom portion exposed in the opening portion of the first circuit board such that the bottom portion of each of the first via conductors is forming a mounting pad positioned to mount an electronic component, the bottom portion of each of the first via conductors is formed such that the bottom portion is recessed from the third surface of the second circuit board, and each of the first via conductors comprises a seed layer formed on a side wall of a respective one of the first via openings and an electrolytic plating layer formed on the seed layer such that the bottom portion of each of the first via conductors has the electrolytic plating layer and the seed layer surrounding the electrolytic plating layer and that the seed layer in the bottom portion is recessed from the electrolytic plating layer.

2. The printed wiring board according to claim 1, wherein each of the first via openings is tapering from the lower surface toward the upper surface of the first resin insulating layer such than each of the first via conductors is tapering from the lower surface toward the upper surface of the first resin insulating layer.

3. The printed wiring board according to claim 1, wherein the opening portion of the first circuit board is formed such that the opening portion is tapering from the second surface toward the first surface of the first circuit board.

4. The printed wiring board according to claim 1, wherein the second circuit board has a recessed portion connected to the opening portion of the first circuit board.

5. The printed wiring board according to claim 1, wherein the second circuit board has a recessed portion formed in the opening portion of the first circuit board.

6. The printed wiring board according to claim 2, wherein the opening portion of the first circuit board is formed such that the opening portion is tapering from the second surface toward the first surface of the first circuit board.

7. The printed wiring board according to claim 2, wherein the second circuit board has a recessed portion connected to the opening portion of the first circuit board.

8. The printed wiring board according to claim 2, wherein the second circuit board has a recessed portion formed in the opening portion of the first circuit board.

9. The printed wiring board according to claim 3, wherein the second circuit board has a recessed portion connected to the opening portion of the first circuit board.

10. The printed wiring board according to claim 3, wherein the second circuit board has a recessed portion formed in the opening portion of the first circuit board.

11. The printed wiring board according to claim 7, wherein the opening portion of the first circuit board is formed such that the opening portion is tapering from the second surface toward the first surface of the first circuit board.

12. A printed wiring board, comprising:
a first circuit board having a first surface and a second surface on an opposite side with respect to the first surface; and
a second circuit board having a third surface and a fourth surface on an opposite side with respect to the third surface and having a mounting area on the third surface of the second circuit board, wherein the first circuit board is laminated on the third surface of the second circuit board such that the first surface of the first circuit board faces the third surface of the second circuit board, and the first circuit board comprises reinforcing material and has an opening portion exposing the mounting area of the second circuit board, the second circuit board comprises a first resin insulating layer having a plurality of first via openings extending from an upper surface to a lower surface of the first resin insulating layer, a first inner conductive layer formed on the lower surface of the first resin insulating layer, and a plurality of first via conductors formed in the plurality of first via openings of the first resin insulating layer, respectively, the upper surface of the first resin insulating layer is forming the third surface of the second circuit board, each of the first via conductors has a bottom portion exposed in the opening portion of the first circuit board such that the bottom portion of each of the first via conductors is forming a mounting pad positioned to mount an electronic component, and each of the first via conductors comprises a seed layer formed on a side wall of a respective one of the first via openings and an electrolytic plating layer formed on the seed layer such that the bottom portion of each of the first via conductors has the electrolytic plating layer and the seed layer surrounding the electrolytic plating layer and that the seed layer in the bottom portion is recessed from the electrolytic plating layer.

13. The printed wiring board according to claim 12, wherein each of the first via openings is tapering from the lower surface toward the upper surface of the first resin insulating layer such than each of the first via conductors is tapering from the lower surface toward the upper surface of the first resin insulating layer.

14. The printed wiring board according to claim 12, wherein the opening portion of the first circuit board is formed such that the opening portion is tapering from the second surface toward the first surface of the first circuit board.

15. The printed wiring board according to claim 12, wherein the second circuit board has a recessed portion connected to the opening portion of the first circuit board.

16. The printed wiring board according to claim 12, wherein the second circuit board has a recessed portion formed in the opening portion of the first circuit board.

17. The printed wiring board according to claim 13, wherein the opening portion of the first circuit board is formed such that the opening portion is tapering from the second surface toward the first surface of the first circuit board.

18. The printed wiring board according to claim 13, wherein the second circuit board has a recessed portion connected to the opening portion of the first circuit board.

19. The printed wiring board according to claim 13, wherein the second circuit board has a recessed portion formed in the opening portion of the first circuit board.

20. The printed wiring board according to claim 14, wherein the second circuit board has a recessed portion connected to the opening portion of the first circuit board.

* * * * *